(12) United States Patent
Cohn et al.

(10) Patent No.: US 6,523,154 B2
(45) Date of Patent: Feb. 18, 2003

(54) METHOD FOR SUPPLY VOLTAGE DROP ANALYSIS DURING PLACEMENT PHASE OF CHIP DESIGN

(75) Inventors: John M. Cohn, Richmond, VT (US); James Venuto, Poughkeepsie, NY (US); Ivan L. Wemple, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 09/737,012

(22) Filed: Dec. 14, 2000

(65) Prior Publication Data

US 2002/0112212 A1 Aug. 15, 2002

(51) Int. Cl.$^7$ .................. G06F 17/50; G06F 17/11; G06F 17/16
(52) U.S. Cl. .................. 716/6; 716/10; 703/14
(58) Field of Search ............... 716/1–21; 703/14–16

(56) References Cited

U.S. PATENT DOCUMENTS

| | | | | |
|---|---|---|---|---|
| 5,084,824 A | | 1/1992 | Lam et al. ............... | 716/11 |
| 5,305,229 A | * | 4/1994 | Dhar ...................... | 703/14 |
| 5,379,231 A | * | 1/1995 | Pillage et al. ........... | 703/14 |

(List continued on next page.)

OTHER PUBLICATIONS

Panda et al., "Model and Analysis for Combined Package and On–chip Power Grid Simulation", IEEE Proceedings of the 2000 International Symposium on Lower Power Electronics and Design, Jul. 26–27, 2000, pp. 179–184.*

Nassif et al., "Multi–Grid Methods for Power Grid Simulation", IEEE International Symposium on Circuits and Systems, vol. 5, May 28–31, 2000, pp. 457–460.*

Dutta et al., "A Comprehensive Delay Model for CMOS Inverters", IEEE Journal of Solid–State Circuits, vol. 30, No. 8, Aug. 1995, pp. 864–871.*

Ronne–Hansen, J., "A General Model for Requesting Arbitrary Unsymmetries in Various Types of Network Analysis", IEEE Transactions on Power Systems, vol. 12, No. 3, Aug. 1997, pp. 1323–1330.*

(List continued on next page.)

*Primary Examiner*—Vuthe Siek
*Assistant Examiner*—Phallaka Kik
(74) *Attorney, Agent, or Firm*—Delio & Peterson LLC; Peter W. Peterson; Richard M. Kotulak

(57) ABSTRACT

A method of analyzing supply voltage drops in a power grid for distributing power to an integrated circuit chip during design. The method initially comprises providing a library of circuits for use in designing an integrated circuit chip and determining a supply current requirement and an operating voltage range for each circuit in the circuit library. The method then includes calculating an admittance matrix representing the power grid with a pre-specified array of circuit ports defined by intersection of the power grid and a modeling grid, assigning regions of the power grid to each of the ports, and placing a set of circuits from the circuit library in regions on the power grid. The method further includes calculating a total node current at each of the ports by summing current requirements of all of the circuits located in the regions, calculating a node voltage at each of the ports by solving a system of linear equations corresponding to the calculated admittance matrix, imposing a penalty to each node having a node voltage outside of a predetermined range, and calculating the node voltages and the penalties to a cost-based floorplanning/placement analysis tool.

15 Claims, 7 Drawing Sheets

U.S. PATENT DOCUMENTS

| | | | | |
|---|---|---|---|---|
| 5,392,221 A | * | 2/1995 | Donath et al. | 716/6 |
| 5,461,576 A | * | 10/1995 | Tsay et al. | 716/6 |
| 5,519,633 A | * | 5/1996 | Chang et al. | 716/19 |
| 5,559,715 A | * | 9/1996 | Misheloff | 703/19 |
| 5,625,803 A | * | 4/1997 | McNelly et al. | 703/14 |
| 5,701,071 A | | 12/1997 | Liou et al. | 323/220 |
| 5,768,145 A | * | 6/1998 | Roethig | 703/14 |
| 5,794,008 A | * | 8/1998 | Meyers et al. | 716/4 |
| 5,835,380 A | * | 11/1998 | Roethig | 716/2 |
| 5,878,053 A | | 3/1999 | Koh et al. | 714/724 |
| 5,883,814 A | * | 3/1999 | Luk et al. | 716/2 |
| 5,901,063 A | | 5/1999 | Chang et al. | 716/4 |
| 5,901,305 A | | 5/1999 | Futagami | 703/16 |
| 5,903,469 A | * | 5/1999 | Ho | 716/5 |
| 5,933,358 A | | 8/1999 | Koh et al. | 703/14 |
| 5,943,243 A | * | 8/1999 | Sherlekar et al. | 716/9 |
| 5,946,482 A | * | 8/1999 | Barford et al. | 703/14 |
| 6,029,117 A | * | 2/2000 | Devgan | 702/58 |
| 6,066,177 A | * | 5/2000 | Hatsuda | 703/19 |
| 6,134,513 A | * | 10/2000 | Gopal | 703/14 |
| 6,182,023 B1 | * | 1/2001 | Ohtsu et al. | 703/5 |
| 6,202,191 B1 | * | 3/2001 | Filippi et al. | 716/5 |
| 6,247,162 B1 | * | 6/2001 | Fujine et al. | 716/2 |
| 6,253,353 B1 | * | 6/2001 | Mahanpour et al. | 716/4 |
| 6,301,690 B1 | * | 10/2001 | Ditlow et al. | 716/5 |
| 6,314,389 B2 | * | 11/2001 | Milsom | 703/14 |
| 6,345,379 B1 | * | 2/2002 | Khouja et al. | 716/4 |
| 6,385,565 B1 | * | 5/2002 | Anderson et al. | 703/18 |
| 6,405,354 B1 | * | 6/2002 | Itazu et al. | 716/8 |
| 6,453,444 B1 | * | 9/2002 | Shepard | 716/2 |
| 2002/0116696 A1 | * | 8/2002 | Suaya et al. | 716/6 |

OTHER PUBLICATIONS

Ying et al., "An Analytical Approach to Floorplanning for Hierarchical Building Blocks Layout", IEEE Transactions on Computer–Aided Design, vol. 8, No. 4, Apr. 1989, pp. 403–412.*

Lin et al., "A New Building Algorithm for Z–Matrix", Proceedings of International Conference on Power System Technology, vol. 2, Dec. 4–7, 2000, pp. 1041–1046.*

Ching–Han Tsai and Sung–Mo (Steve) Kang; *Cell–Level Placement for Improving Substrate Thermal Distribution*, IEEE Transactions On Computer–Aided Design of Integrated Circuits and Systems, vol. 19, No. 2, Feb. 2000, pp. 253–266.

Balsha R. Stanisic, Rob A. Rutenbar and L. Richard Carley; *Power Distribution Synthesis For Aanalog and Mixed–Signal ASICS in Rail*; IEEE 1993 Custom Integrated Circuits Conference, pp. 17.4.1–17.4.5, Mar. 1993.

Sujoy Mitra, Rob A. Rutenbar, L. Richard Carley and David Allstot; *Substrate–Aware Mixed–Signal Macrocell Placement in WRIGHT*; IEEE Journal of Solid–State Circuits, vol. 30, No. 3. Mar. 1995, pp. 269–278.

* cited by examiner

METHOD FOR SUPPLY VOLTAGE DROP ANALYSIS DURING PLACEMENT PHASE OF CHIP DESIGN

BACKGROUND OF THE INVENTION

1. Field of the Invention

The present invention relates to integrated circuit chips and, in particular, to power supply voltage analysis during the designing of such integrated circuit chips.

2. Description of Related Art

A current technological trend in semiconductor design, especially for application specific integrated circuits (ASICs) and other advanced types of chips, is to reduce operating power. This trend drives the power supply voltages and, in turn, the device threshold voltages to lower levels. As the device threshold voltage $V_t$ and the power supply voltage $V_{dd}$ are reduced, the ratios of noise voltages to $V_t$ and $V_{dd}$ increase because the noise levels do not scale down at the same rate as $V_t$ and $V_{dd}$. Consequently, circuit sensitivity to noise is increased.

Modern technology trends also drive new designs to deliver higher levels of performance, most commonly achieved by increasing signal current levels and/or duty cycles. This further exacerbates the noise problem because the high current levels create local and often sizable resistive voltage drops in the power supply wiring. As a consequence, the full $V_{dd}$ supply voltage may not be available to power some of the circuits on the chip.

Designers typically address supply noise problems in indirect ways. In some cases, the chip circuitry is painstakingly designed to be more functionally tolerant of a power-supply decrease, also referred to as a power supply collapse. Alternatively, the power distribution can be designed more conservatively, for example, with wider, thicker, or more abundant wiring, to limit the levels of local on-chip current densities. Both approaches apply heuristic and expensive over-design, often sacrificing performance, power consumption, chip area, and/or cost. Moreover, problems related to noise sensitivity are commonly not detected until very late in the design cycle or, worse, after the chip has already been fabricated. Subsequent solutions rely on expensive and time-consuming remodeling and simulation and/or redesign activity.

A few early-stage design strategies aimed at addressing some aspects of the noise problem have been outlined in the academic literature. The article by Stanisic et al., "Power Distribution Synthesis for Analog and Mixed-Signal ASICs in RAIL", *Proceedings of the IEEE Custom Integrated Circuits Conference,* pp. 17.4.1–17.4.5, 1993, describes techniques to synthesize an "optimal" power distribution network (i.e., determine the power grid topology, interconnect wirewidths, etc.) according to the electrical requirements of fixed, pre-placed circuit objects. This method uses an optimization technique based on simulated annealing, which analyzes iterated random assignments of power-net segment widths, and seeks to converge to an optimum topology using metrics based on the electrical response of the network to the modeled behavior of the circuit objects. In contrast, the article by Mitra et al., "Substrate-Aware Mixed-Signal Macrocell Placement in WRIGHT", *IEEE Journal of Solid-State Circuits,* vol. 30, no. 3, pp. 269–278, March 1995, seeks an optimum placement of circuit objects in the context of substrate noise, a phenomenon that most commonly occurs when fast digital circuitry induces variations in the chip substrate voltage which can adversely affect the performance of sensitive analog circuits on the same chip. This work relies on a simulated-annealing-based optimization loop, which iteratively generates an electrical model of the chip substrate and quantitatively assesses the level of the digital/analog interactions for successive placement configurations until some pre-specified metric is satisfied.

One approach to the power distribution problem might involve devising a technique to quickly assess the effects of voltage collapse everywhere in the power grid for any candidate circuit placement. In practice, this has proven difficult—the quantities of placed circuit objects (tens of thousands or more) and the size of the full-chip power distribution are enormous. The first approach described above (i.e., that of Stanisic et al.) targets a small portion of the power distribution, and considers only a handful of circuit objects, specifically, "tens of blocks". The second approach (by Mitra et al.) uses a coarse model of the chip substrate and does not consider the topology of the power distribution at all. The quantity of cell objects is also limited (less than one hundred in the described examples). Neither approach is applicable to a detailed full-chip optimization process. At each and every step, the computation-time complexity scales superlinearly with both the number of circuit objects and the number of circuit nodes in the network model. Moreover, for realistic designs, it would not be unreasonable to require thousands of model updates and corresponding solutions before obtaining an acceptable result. Clearly, any method which limits the analysis complexity at each step of the iterated process would prove useful for analyzing power-grid problems during chip design.

SUMMARY OF THE INVENTION

The inventors have determined that consideration of circuit noise sensitivity and power supply voltage drop during chip physical design would be very beneficial in designing and fabricating efficient and reliable integrated circuit chips.

Bearing in mind the problems and deficiencies of the prior art, it is therefore an object of the present invention to provide an improved method of designing integrated circuits.

It is another object of the present invention to provide an improved method of power supply voltage analysis during the designing of integrated circuit chips.

A further object of the invention is to provide a power supply voltage analysis method for use during early stages of designing of such integrated circuit chips.

It is yet another object of the present invention to provide a power supply voltage analysis method which evaluates noise sensitivity of such integrated circuit chips.

Still other objects and advantages of the invention will in part be obvious and will in part be apparent from the specification.

The above and other objects and advantages, which will be apparent to one of skill in the art, are achieved in the present invention which is directed to, in a first aspect, a method of designing an integrated circuit within a power grid comprising initially characterizing circuits in a circuit library for supply currents and voltage ranges and constructing a power grid model based on general power requirements of the integrated circuit under design. The method then includes calculating an impedance matrix representing impedance between ports in the power grid model, assigning selected circuits from the library to the ports, calculating current and voltage at each of the ports, using a cost function to calculate the cost of placement of the assigned circuits, and perturbing the assignment of the circuits, if the cost of such placement does not meet design requirements.

The current at each of the ports may be calculated by summing current requirements of all of the circuits located in the region of the port, and the voltage at each of the ports may be calculated by solving a reduced, pre-factorized set of linear equations that describe the power-grid impedance, supply voltage sources, and port current sources.

Preferably, each circuit in the object library is characterized to determine its average DC supply current requirement and power-supply voltage range for which it functions acceptably. There may be further included, for each circuit in the object library, tabulated current values which depend on relative placement and load to approximate the supply current dependence on output capacitance.

The power grid model represents circuit ports defined by intersection of the power grid model and the physical power grid of an integrated circuit, and preferably the power grid model has a periodicity of a multiple of the periodicity of the physical power grid of the integrated circuit.

After calculating the impedance matrix, the method may further include assigning regions of the power grid to each of the ports. After calculating current and voltage at each node, the method may further include imposing a penalty to each node having a node voltage outside of a predetermined range.

In another aspect, the present invention provides a method of analyzing supply voltage drops in a power grid for distributing power to an integrated circuit chip during design. The method initially comprises providing a library of circuits for use in designing an integrated circuit chip and determining a supply current requirement and an operating voltage range for each circuit in the circuit library. The method then includes calculating an admittance matrix representing the power grid with a pre-specified array of circuit ports defined by intersection of the power grid and a modeling grid, assigning regions of the power grid to each of the ports, and placing a set of circuits from the circuit library in regions on the power grid. The method further includes calculating a total node current at each of the ports by summing current requirements of all of the circuits located in the regions, calculating a node voltage at each of the ports by solving a pre-factorized matrix representation of a system of linear equations corresponding to the calculated admittance matrix, imposing a penalty to each node having a node voltage outside of a predetermined range, and writing the node voltages and the penalties to a cost-based floorplanning/placement analysis tool.

After writing the node voltages and the penalties to a cost-based floorplanning/placement analysis tool, the method may further include using a cost function to calculate the cost of placement of the assigned circuits, and perturbing the placement of the circuits, if the cost of such placement does not meet design requirements.

Preferably, the method includes calculation of a passive, reduced power grid conductance matrix, G', representing a major constituent of the admittance matrix and an electrically identical representation of all power grid resistive elements. The conductance matrix, G' may be calculated as follows:

$$G \cdot v = i$$

$$\begin{bmatrix} G_{pp} & G_{pi} \\ G_{ip} & G_{ii} \end{bmatrix}$$

$$G' \cdot v_p = i_p$$

$$G' = G_{pp} - (G_{pi} \cdot G_{ii}^{-1} \cdot G_{ip})$$

where G represents the non-reduced admittance representation of the power grid resistor network; v represents the vector of all node voltages in the non-reduced power grid resistor network; i represents the branch currents through all resistors in the non-reduced power grid resistor network;

$$\begin{bmatrix} G_{pp} & G_{pi} \\ G_{ip} & G_{ii} \end{bmatrix}$$

represents a specific node-ordered variant of G; $G_{pp}$ is the admittance representation of power-grid resistors connecting two port nodes; $G_{ip}$ and $G_{pi}$ are the admittance representations of power-grid resistors connecting port- and internal nodes; $G_{ii}$ is the admittance representation of power-grid resistors connecting two internal nodes; $v_p$ is the vector of power-grid port node voltages; $v_i$ is the vector of power-grid internal node voltages; $i_p$ is the vector of current sources attached to power-grid port nodes. A 'port' node is defined as a network node that is electrically connected to a voltage or current source. All other nodes are 'internal' nodes.

In a further aspect, the present invention provides a program storage device readable by a machine, tangibly embodying a program of instructions executable by the machine to perform method steps for designing an integrated circuit within a power grid using a library of circuits. The method steps comprise characterizing circuits in the library for supply currents and voltage ranges, constructing a power grid model based on general power requirements of the integrated circuit under design, calculating an impedance matrix representing impedance between ports in the power grid model, assigning selected circuits from the library to the ports, calculating current and voltage at each of the ports, using a cost function to calculate the cost of placement of the assigned circuits, and perturbing the assignment of the circuits, if the cost of such placement does not meet design requirements.

Yet another aspect of the present invention provides a program storage device readable by a machine, tangibly embodying a program of instructions executable by the machine to perform method steps for analyzing supply voltage drops in a power grid for distributing power to an integrated circuit chip during design the program utilizing a library of circuits employed in designing an integrated circuit chip. The method steps comprise determining a supply current requirement and an operating voltage range for each circuit in the circuit library; calculating an admittance matrix representing the power grid with a pre-specified array of circuit ports defined by intersection of the power grid and a modeling grid; assigning regions of the power grid to each of the ports; placing a set of circuits from the circuit library in regions on the power grid; calculating a total node current at each of the ports by summing current requirements of all of the circuits located in the regions; calculating a node voltage at each of the ports by solving a pre-factorized representation of a system of linear equations corresponding to the calculated admittance matrix; imposing a penalty to each node having a node voltage outside of a predetermined range; and writing the node voltages and the penalties to a cost-based floorplanning/placement analysis tool.

Another related aspect provides a computer program product comprising a computer usable medium having computer readable program code means embodied therein for designing an integrated circuit within a power grid, the computer program product utilizing a library of circuits for use in designing an integrated circuit chip. The computer readable program code means in the computer program product comprises computer readable program code means for characterizing the circuits in the library for supply currents and voltage ranges; computer readable program code means for constructing a power grid model based on general power requirements of the integrated circuit under design; computer readable program code means for calculating an impedance matrix representing impedance between ports in the power grid model; computer readable program code means for assigning selected circuits from the library to the ports; computer readable program code means for calculating current and voltage at each of the ports; computer readable program code means for using a cost function to calculate the cost of placement of the assigned circuits; and computer readable program code means for perturbing the assignment of the circuits, if the cost of such placement does not meet design requirements.

A further related aspect of the invention provides a computer program product comprising a computer usable medium having computer readable program code means embodied therein for analyzing supply voltage drops in a power grid for distributing power to an integrated circuit chip during design, the computer program product utilizing a library of circuits employed in designing an integrated circuit chip. The computer readable program code means in the computer program product comprises computer readable program code means for determining a supply current requirement and an operating voltage range for each circuit in the circuit library; computer readable program code means for calculating an admittance matrix representing the power grid with a pre-specified array of circuit ports defined by intersection of the power grid and a modeling grid; computer readable program code means for assigning regions of the power grid to each of the ports; computer readable program code means for placing a set of circuits from the circuit library in regions on the power grid; computer readable program code means for calculating a total node current at each of the ports by summing current requirements of all of the circuits located in the regions; computer readable program code means for calculating a node voltage at each of the ports by solving a system of linear equations corresponding to the calculated admittance matrix; computer readable program code means for imposing a penalty to each node having a node voltage outside of a predetermined range; and computer readable program code means for writing the node voltages and the penalties to a cost-based floorplanning/placement analysis tool.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
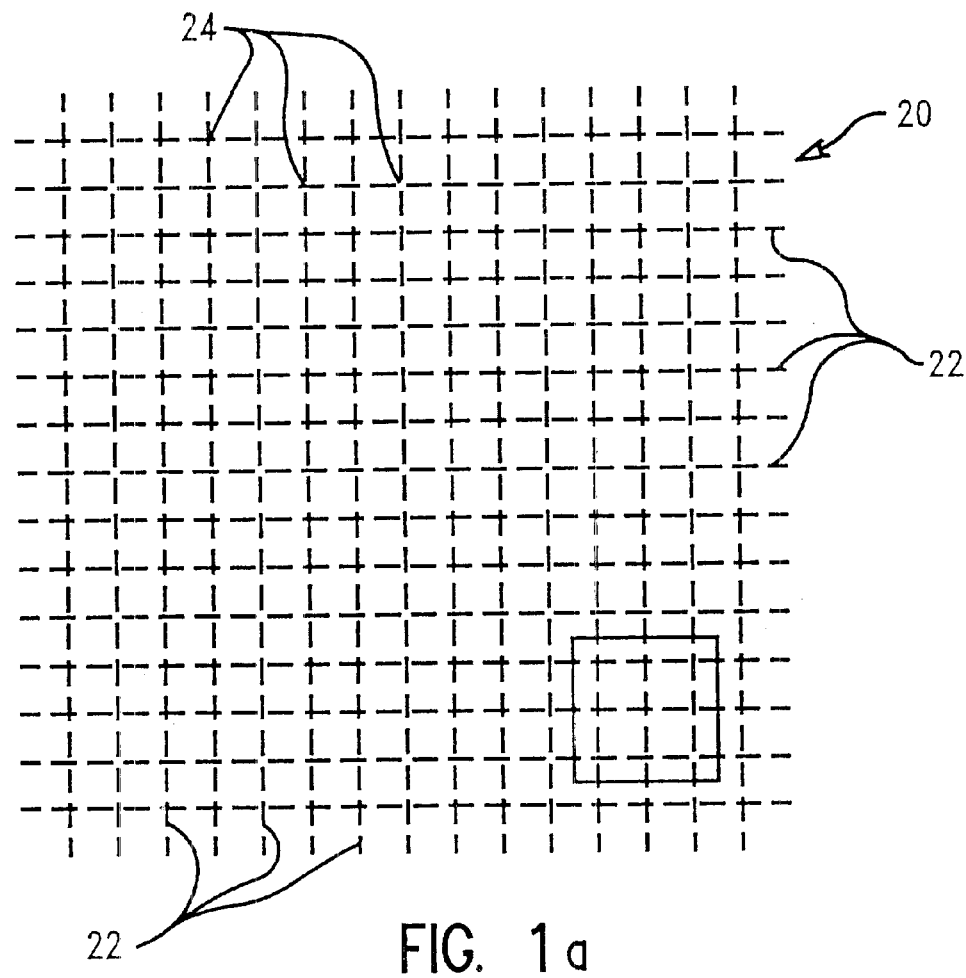
FIG. 1a shows a top plan view of portions of the power distribution network, or grid, on a typical semiconductor chip.

In describing the preferred embodiment of the present invention, reference will be made herein to FIGS. 1–8 of the drawings in which like numerals refer to like features of the invention. Features of the invention are not necessarily shown to scale in the drawings.

Figure 1B:
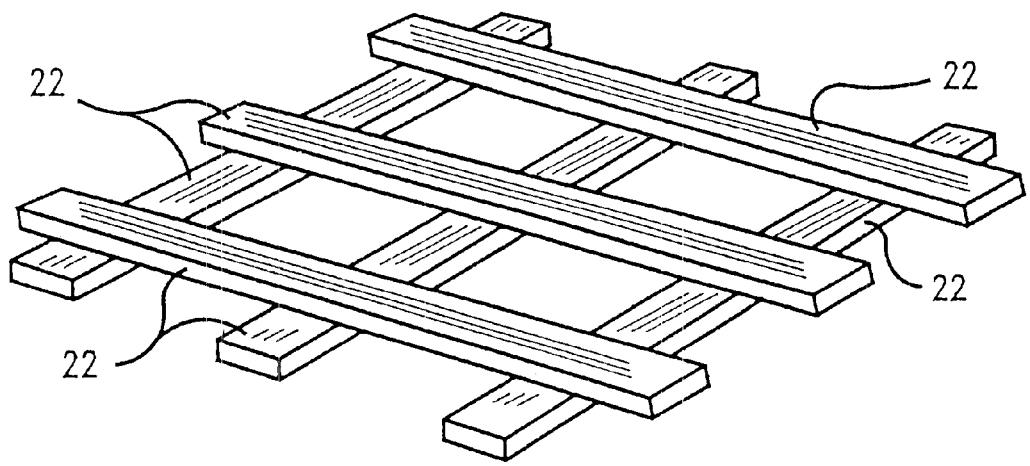
FIG. 1b shows a three dimensional perspective view of the portion of the power distribution network or grid of FIG. 1a that is indicated by the square.
Figure 2:
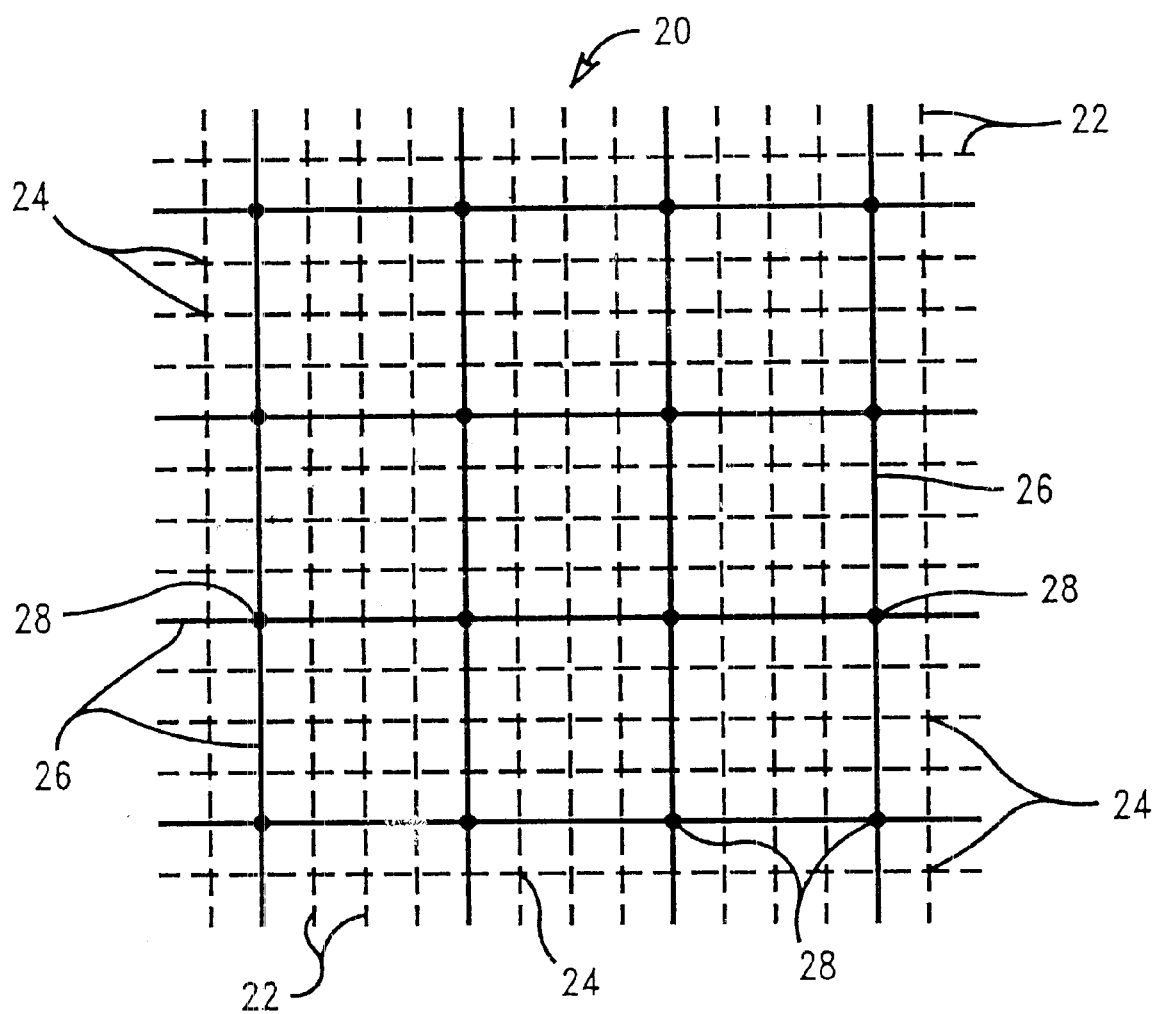
FIG. 2 shows a top plan view of a portion of the power distribution network of FIG. 1a, along with a superposition of a corresponding coarse grid, and several "nodes" in the corresponding coarse grid, which are useful for modeling and analyzing the electrical behavior of the network.

The present invention allows for the analysis of local and global voltage drop in the power grid of an integrated circuit during the floorplanning and circuit placement stage of chip design. A floorplanning/placement analysis tool has been employed in prior art circuit design methods, but without the consideration of circuit noise sensitivity, power supply voltage drop, and other features provided by the present invention, as will be described in detail below. Such analysis of local and global voltage drop in the power grid provides a means to assess potential power density or noise problems, whose early identification can facilitate the automatic generation of circuit layouts that are more immune to such problems. The present invention in particular addresses the power-supply noise problem by analyzing voltage drops in the power grid during the chip physical design stage. In general, the floor planning/placement process begins with a regular and loosely established power grid and aims to determine "good" relative chip locations for the functional blocks that comprise the circuit implementation. The methods typically employed are iterative; that is, at each step in the process a candidate placement is collectively analyzed with respect to some pre-established criteria. The placement is then perturbed and re-analyzed repeatedly until an optimal or near-optimal placement is identified. In nearly all methodologies, the figure-of-merit used to assess the placement quality considers circuit performance and/or chip area. The present invention also includes methods whereby potential circuit placements are additionally and explicitly evaluated with respect to voltage drops in the on-chip power distribution. FIGS. 1a and 1b represents a portion of the actual power distribution network, or grid, on a typical semiconductor chip. In a typical implementation, the network might be comprised of multiple levels of orthogonally placed wires (two levels are shown), interconnected with "vias" at each intersection of wires on adjacent levels. FIG. 2 shows the same portion of the power grid, 20 overlaid with a modeling grid.

The actual "physical" power grid is shown with dashed lines, 22, representing actual power distribution wires. Physical intersections of adjacent-level power-grid wires are also shown, 24. At the topmost level, the network can be connected to a power supply through the chip package. In this case, the finite resistance of the power grid wiring, 22, contributes to the problem of supply voltage collapse whenever currents are distributed to the chip active circuitry, typically connected at the lower level(s) of the network. As a model for analysis, FIG. 2 also shows solid lines, 26, representing a coarse or modeling grid that the method of the present invention employs for its power supply voltage analysis of the integrated circuit power distribution, 20. In a typical implementation, the periodicity of the coarse gridlines, 26, might be a multiple, e.g., four times that of the actual, physical grid (as will be shown, the coarse-grid model periodicity can be tailored to achieve a desired balance between model accuracy and analysis performance). Dots 28 denote points where the physical grid of wires, 22, and the coarse modeling gridlines, 26, are coincident, i.e., intersect. Dots 28 represent specified electrical "nodes" for a resistive network that models the electrically passive properties of the power grid. Supply current delivered to circuits, or cells, in close proximity to any node, 28, in the network can be approximated as flowing through the corresponding node. In general, circuit objects, or cells, may be in close proximity to a single node, 28, or, their extents may span regions associated with several nodes, 28. In the latter case, the power supply current requirement for a larger cell can be appropriately distributed amongst all proximate ports, 28.

Figure 3:
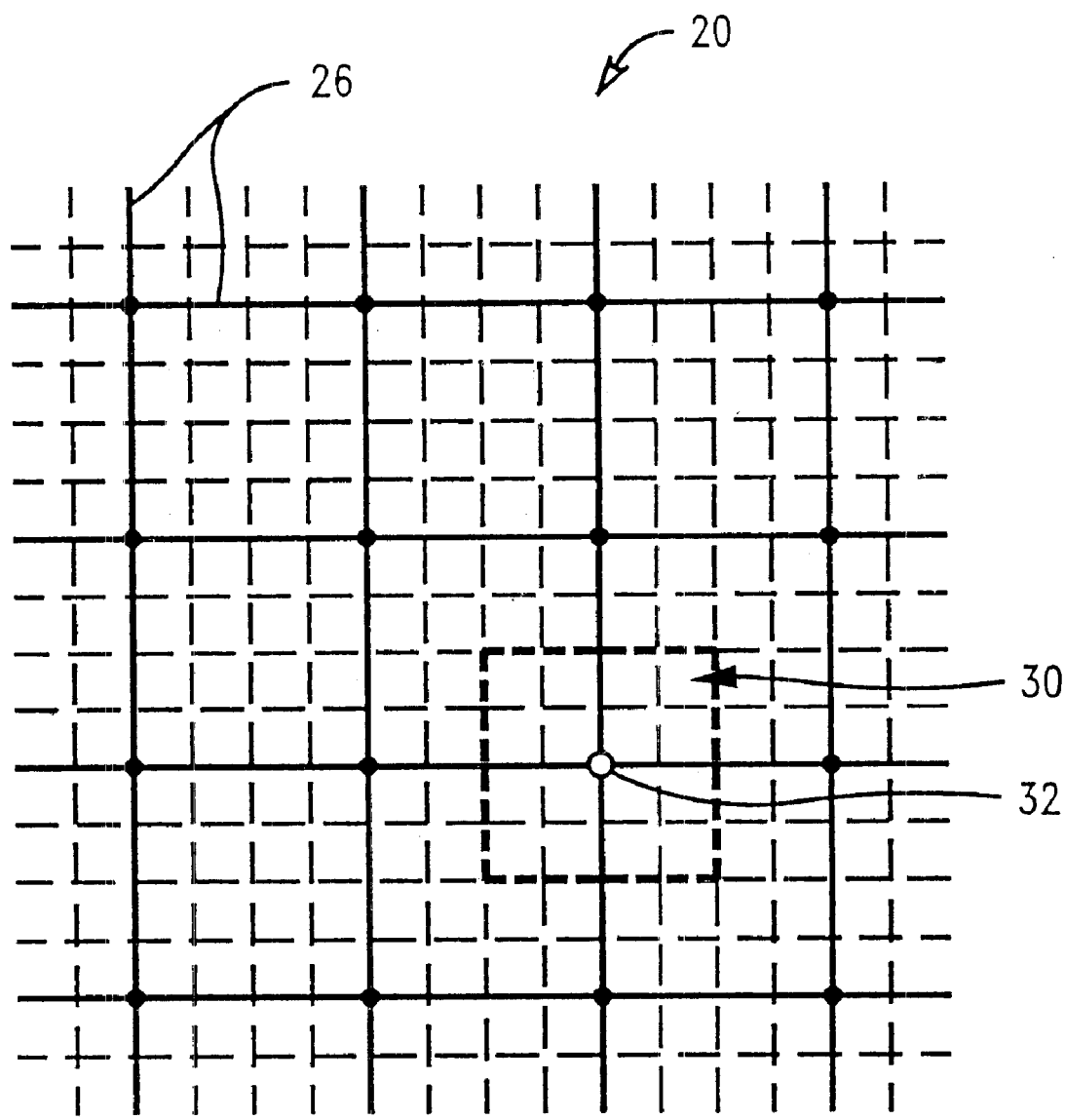
FIG. 3 shows a top plan view of a portion of the power distribution network, a superposition of a corresponding coarse modeling grid, several "nodes" in the coarse grid, and the area of the chip which lies closest to the highlighted node than to all other nodes in the coarse grid.

By way of example, FIG. 3 shows the rectangular region of "proximity," 30, with its associated (and "highlighted") node, 32. This region, 30, is defined by the area of the chip which lies closer to its enclosed port node, 32, than to any other port in the network. Any subsequent description of a circuit object being in "close proximity" to a particular port simply indicates that the circuit is physically closer to that port than to any other port(s). To generalize, a circuit can always be associated with multiple ports if it happens to lie equidistant from two or more port locations. Likewise, its representative current requirement can be subdivided appropriately.

Figure 4:
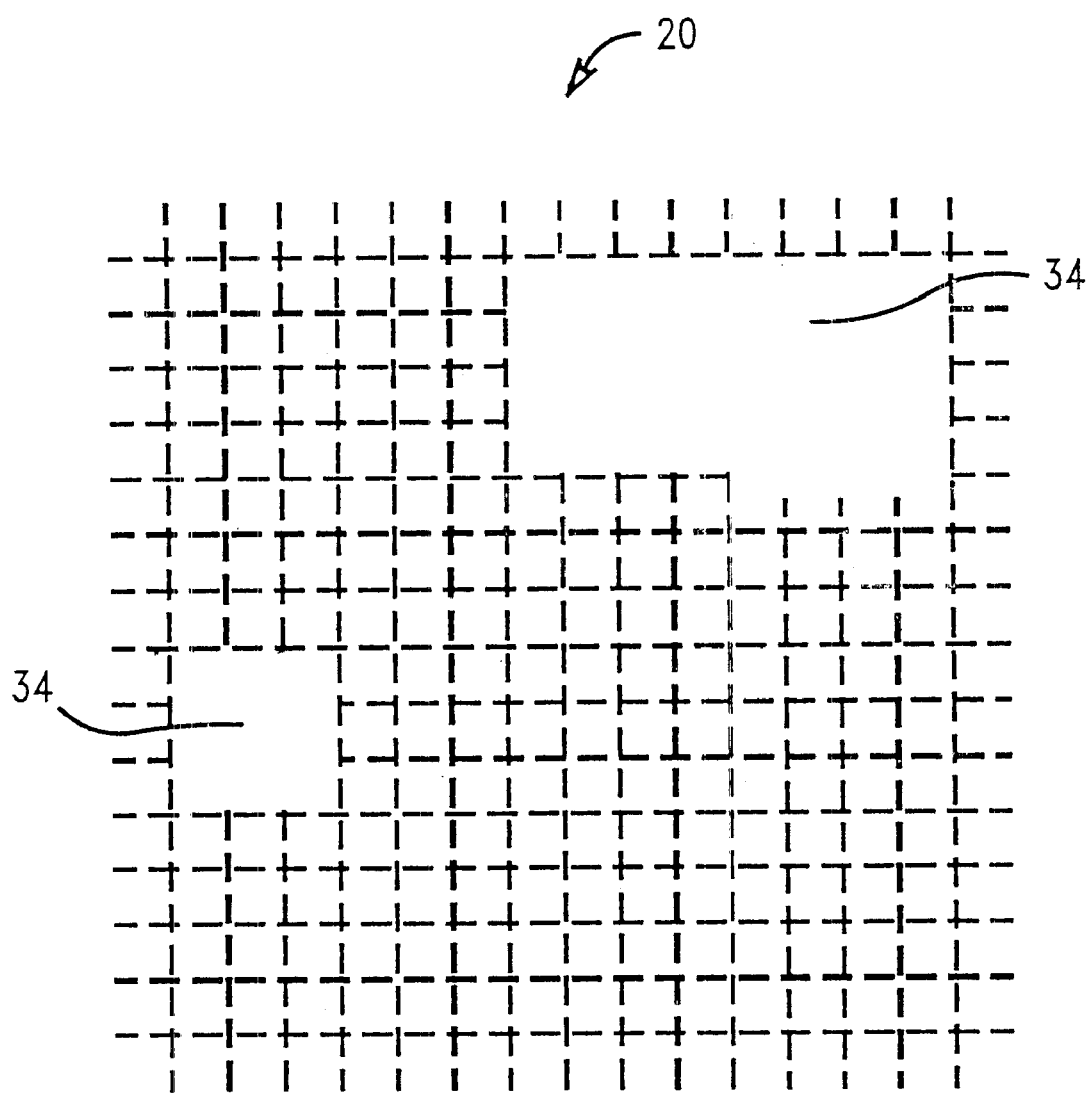
FIG. 4 shows a top plan view of a portion of the on-chip power distribution network, where the grid "regularity" has been disrupted by the pre-placement of large circuit macros.

FIG. 4 depicts circuit macros, or "multiple-cell objects" 34, which are used to represent circuits that do not easily discretize into objects smaller than the pitch of the power grid and/or those circuit blocks that require their own (internal) power distribution. These objects typically disrupt, or "truncate", the regularity of the power grid (as shown in FIGS. 1a, 1b and 2, and described above). Such multiple cell objects or circuit macros, 34, may be cores, I/O circuits, or memory arrays, for example, or any other circuits employed in an integrated circuit design.

Figure 5:
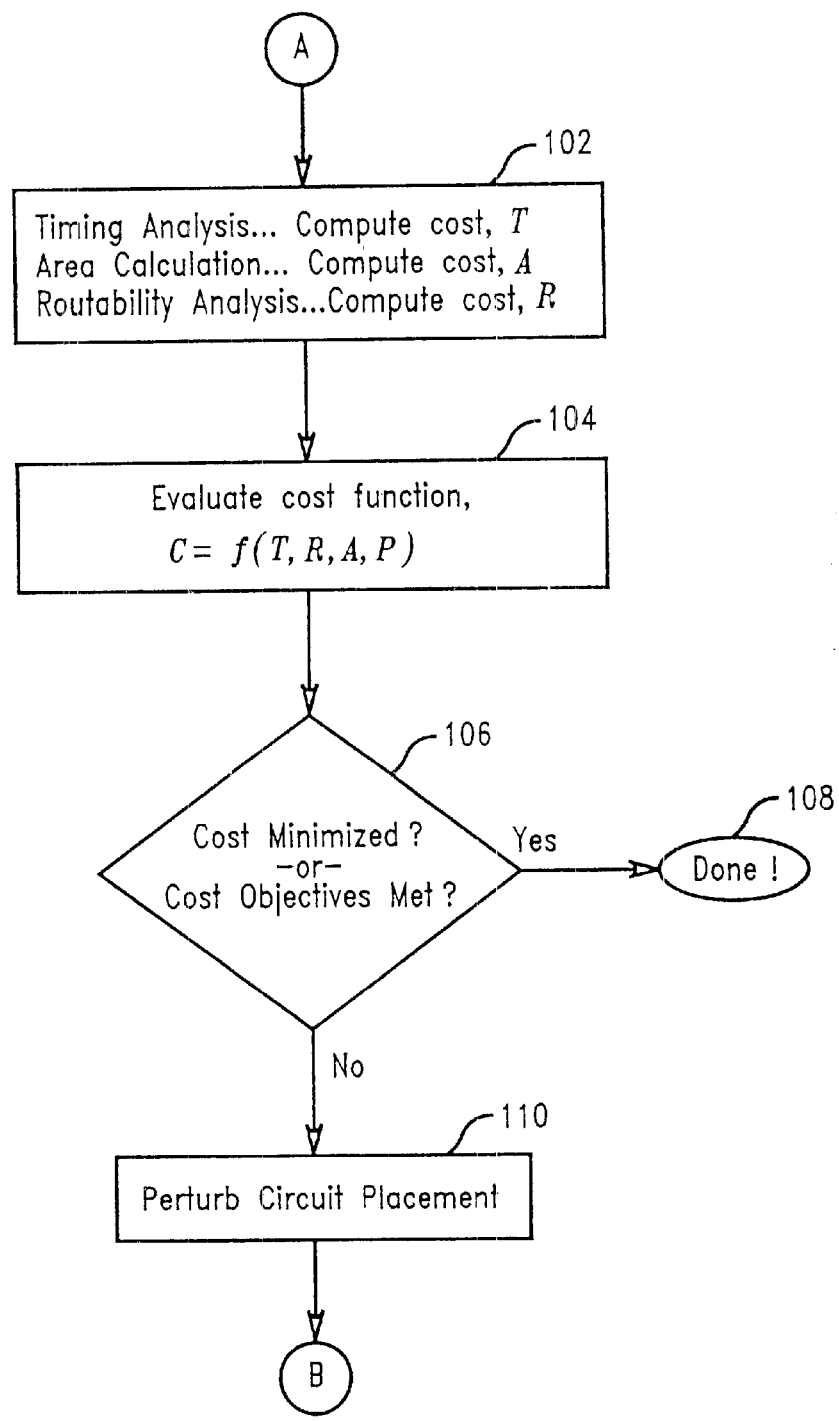
FIG. 5 is a flow diagram showing how power grid analysis results obtained by exercising the present invention are integrated into a prior art chip floorplanning process.
Figure 6:
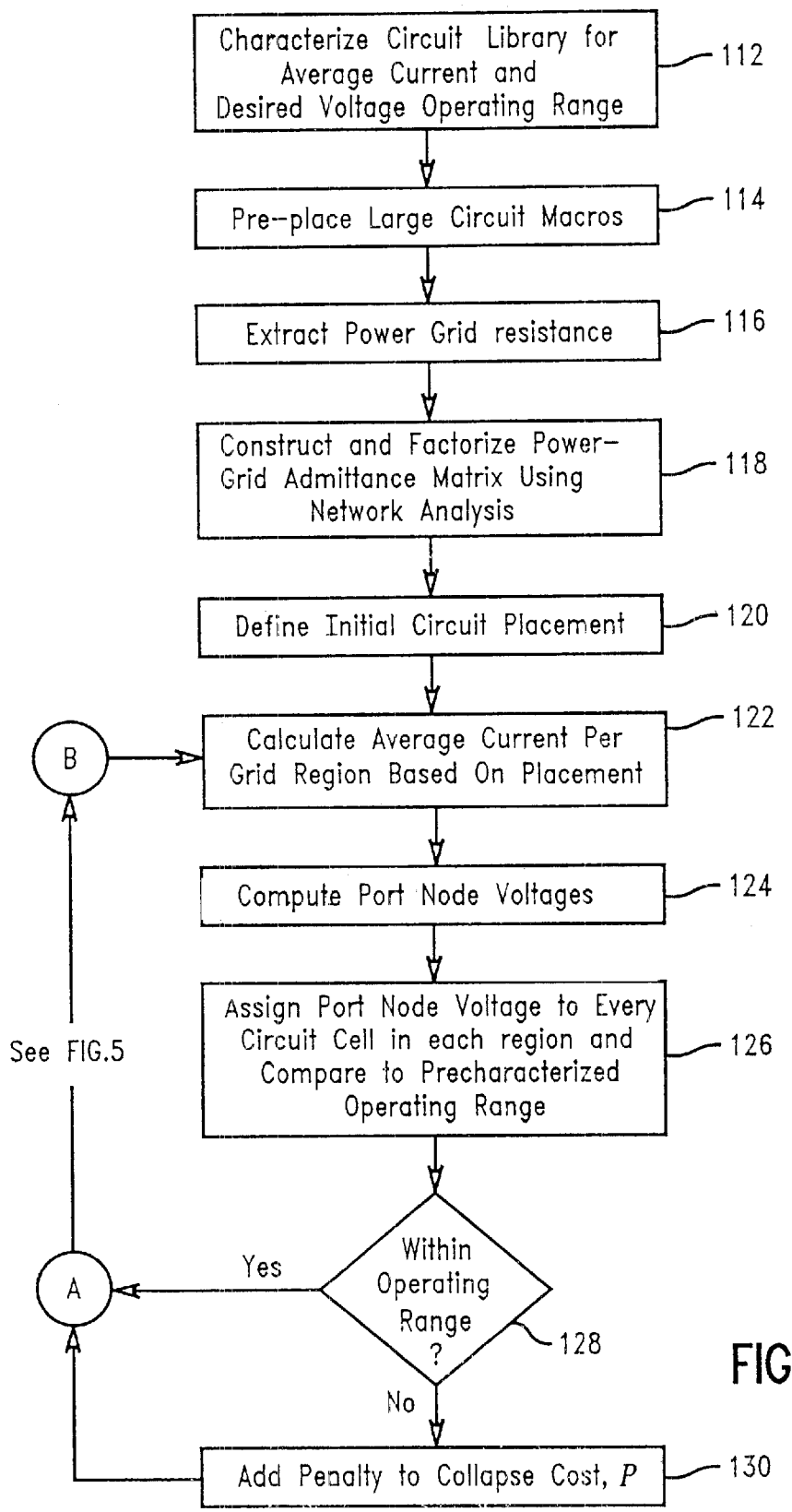
FIG. 6 is a flow diagram of the power grid analysis portion of the present invention referenced in FIG. 5.

The flow diagrams in FIGS. 5 and 6 demonstrate how the power grid analysis of the present invention is integrated into the prior art chip floorplanning process.

Referring to FIG. 5, the first step preferably includes a description of the complete placement of all of the circuit cells comprising the chip design. The placement may be derived from an arbitrary (initial) distribution of circuit cells, or from previous steps in the iterated sequence described shortly. The prior art floorplanning method uses standard timing analysis, area calculation, routing analysis, and/or other techniques, step 102, to calculate a "cost" associated with the candidate circuit placement, step 104. The cost calculation traditionally accounts for chip timing, T, routing quality, R, and chip area, A. The associated "cost function" is denoted in FIG. 5 as:

$$C = f(T, R, A,) \text{ or } C = f(T, R, A, P) \quad \text{(Eq. 1)}$$

where P is a function of the chip's overall noise tolerance, as discussed further below. If, as shown in step 106, the computed cost, C, is less than a predetermined maximum or, alternatively, ceases to decrease after several successive perturbations, the placement process is ended, 108. However, if the cost has not been optimized or does not otherwise meet the specified objectives, then the placement is perturbed, step 110, and the algorithm is repeated. Note that, for each perturbation, circuit objects are moved, and the cost is recalculated, 102, and re-evaluated, 104, until the process terminates as described. The present invention in particular adds power grid characterization and analysis to this cost-calculation loop. With respect to the flow diagram, the power-grid analysis integration insertion points are represented by "A" and "B" in FIG. 5.

Figure 7:
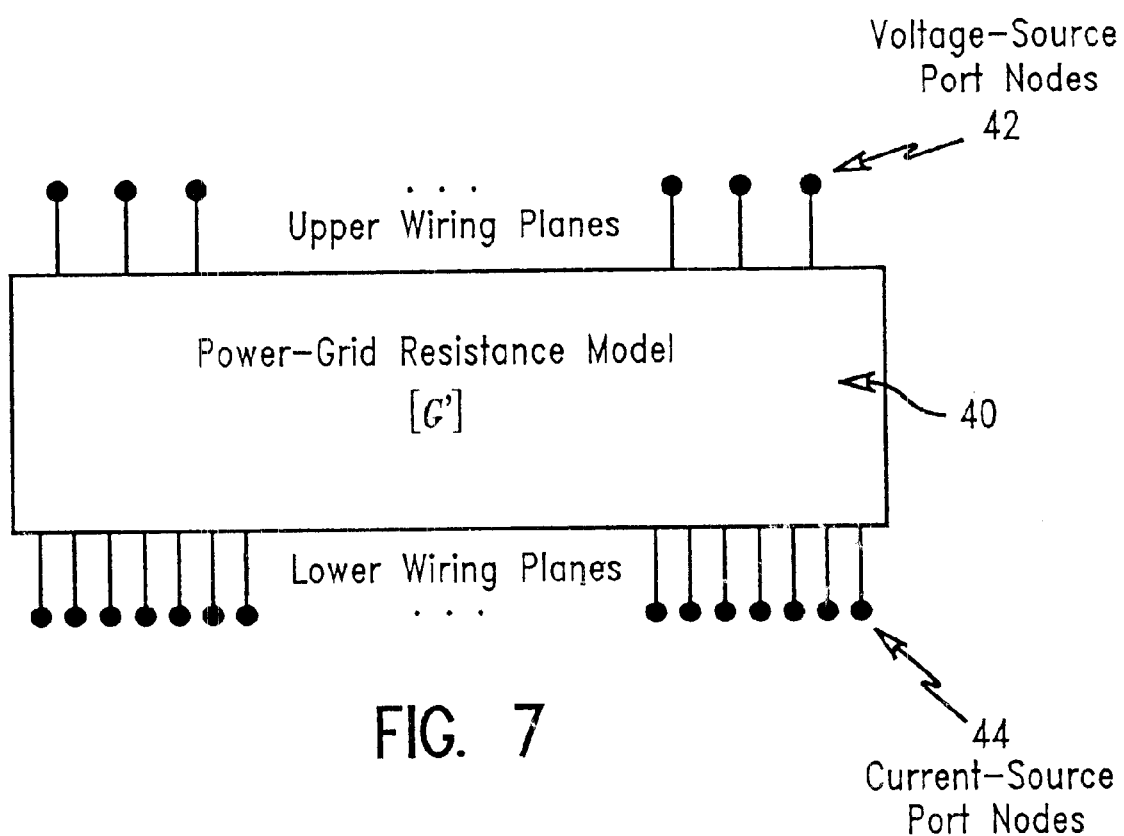
FIG. 7 is a diagram of a typical power-grid network model used by the present invention.
Figure 8:
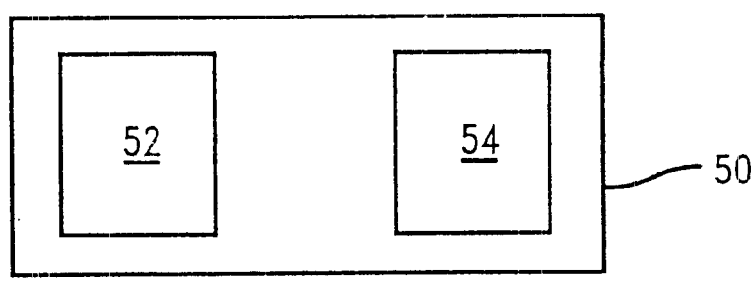
FIG. 8 is a schematic of a typical computer system for executing software incorporating the process of the present invention.

FIG. 6 is a flowchart of the power grid analysis portion of the present invention, previously referenced in FIG. 5. The method preferably requires initial pre-processing, steps 112, 114, 116, and 118, before the power grid analysis can accompany the conventional, prior-art floorplanning analysis on an iterative basis. Such pre-processing uses an object library which is created to contain the different circuits to be employed in the integrated circuit under design. First, as in step 112, each circuit in the object library is characterized to determine its average DC supply current requirement as well as the power-supply voltage range for which it functions acceptably. The characterization can be refined to provide tabulated current values which depend on relative placement and load, for example, to better approximate the supply current dependence on output capacitance. Other refinements are of course possible to enhance the accuracy and usefulness of the current characterization. Second, as in step 114, large circuit macros which tend to displace portions of the "regular" power grid are positioned in fixed locations on the chip layout, and the power grid is modified accordingly. Third, as in step 116, a power grid or network model, as shown in FIG. 7, is constructed based on the extracted power grid, 22, and coarse grid, 26, (of FIG. 2), and methods in accordance with the present invention. FIG. 6 steps 118, 120, 122, 124, 126, 128, and 130 are to be described subsequently.

FIG. 7 depicts a portion of a typical network model used by the present invention, and includes a "reduced" representation of the power distribution conductance (or similarly, resistance), 40, and "port" nodes, 42 and 44, for connecting supply voltage sources, and the current sources, respectively. The current sources model the power-supply current levels required by the placed circuit cells. This model may be developed for a general, all-purpose, "regular" power grid, for example, which might be suitable for several ASIC products or, alternatively, it may be generated to account for the customized local wiring patterns that often accompany pre-placed, fixed circuits (e.g., 34 in FIG. 4, as described above), on a per-product basis. The concept of employing an initial fixed power grid, with accommodations for topology "tailoring" based on the preliminary placement of large circuit blocks is common. In this scenario, modifications to the chip physical design based on the subsequent placement of random-logic circuit objects does not alter the topology or electrical characteristics of the chip power grid. This aspect of design methodology is directly exploited by the present invention. In sharp, contrast, the work described in the aforementioned Stanisic et al. article modifies the power grid itself in an effort to distribute power optimally to pre-placed, fixed circuit blocks. It does not address the placement problem at all, and, in fact, is limited to a very small quantity of circuit objects.

In a typical implementation, the power grid model consists of ideal voltage sources (to represent the power supplies), resistors (to model the wires in the power grid), and ideal current sources (to model the DC power-supply current requirements of the placed cells). Conventional network analysis techniques can be utilized to model the electrical behavior of power grid under study. For example, a so-called "modified nodal formulation" (MNF) of the network topology results in a system of m linear equations which can be solved for the power-grid node voltages and branch currents. The quantity m is the number of ungrounded network nodes, N, plus the quantity of power-supply voltage sources in the power-grid model. Referring to FIG. 2, N is the quantity of network nodes in the physical grid, 22, defined by all adjacent-level wire intersections, 24.

In general, calculation of the power-grid network node voltages requires the simultaneous solution of the m linear equations. Problems of this nature are typically performed on computers using matrix methods, where the system can be expressed mathematically as follows:

$$A \cdot x = b \quad \text{(Eq. 2)}$$

Where, A is a square m×m matrix of coefficients:, $$A = \begin{bmatrix} a_{11} a_{12} & \dots & a_{1m} \\ a_{21} a_{22} & \dots & a_{2m} \\ \dots & \dots & \dots \\ a_{m1} a_{m2} & \dots & a_{mm} \end{bmatrix} \quad \text{(Eq. 3)}$$

b is the "right-hand-side" vector:

$$b = \begin{bmatrix} b \\ b_2 \\ \dots \\ b_m \end{bmatrix}, \quad \text{(Eq. 4)}$$

and x is the vector of unknowns. In the present invention, matrix A is constructed using properties of the modeled power grid, vector b is composed of the voltage and current sources, and x is the unknown vector of node voltages and branch currents.

Linear systems describing DC network analysis problems are often solved using a matrix factorization method called "LU decomposition". By factoring A into a product of a lower triangular matrix, L, and an upper triangular matrix, U, i.e., $$A = L \cdot U \quad \text{(Eq. 5)}$$

the system unknowns can be calculated very inexpensively using forward- and back-substitution techniques. Moreover, once L and U are calculated, the system can be trivially re-solved using different right-hand-side vectors. In the context of the present application, this means that the node voltages and branch currents can be efficiently calculated for an arbitrary distribution of cell current excitations and power-grid voltage sources. This distinction is noteworthy—while the method used to initially calculate the LU factorization has a superlinear computation-time complexity, it is performed only once prior to the described iterative placement process. On the other hand, since the power grid is fixed, and the matrix A can be pre-factorized using a product of triangular matrices, subsequent voltage/current solutions derived from each iterated circuit placement can be generated very efficiently. Since placement iteration occurs in the "innermost" loop of the optimization algorithm, the pre-factorization of A is essential to the usefulness of the present invention. Moreover, this approach is clearly distinct from those of the aforementioned Stanisic et al. and Mitra et al. articles, both of which alter the electrical characteristics of the modeled power network inside the optimization loop. That said, both approaches must essentially reformulate, re-factorize, and re-solve the corresponding conductance matrix at each and every iteration associated with the optimization. Since the computational performance is most adversely affected by the factorization process, the referenced strategies are practically limited to significantly smaller networks, and could not reasonably accommodate the large power grids handled by the present invention.

For practical power-grid analysis problems, the matrix size, m, can grow very large. Typically, it remains prohibitively expensive even to exercise only the described forward/back substitutions repeatedly throughout the placement process. Strictly speaking, however, it is not necessary to compute the (complete) vector of voltages for all ungrounded circuit nodes, N, but rather only for the cell-attach nodes, or "ports", defined by the intersections of the coarse modeling grid, 26, and the physical grid, 22 (FIG. 2), and shown as "current-source port nodes", 44, in FIG. 7. In fact, special attention to node ordering during the formulation of the system matrix, A, can be exploited to reduce the problem size considerably.

For the described power-grid problem, the MNF "admittance" matrix, A, is almost entirely comprised of the power-grid nodal conductance matrix, G, which represents the power grid resistor elements, where $$G'' v_p = i_p, \quad \text{(Eq. 6)}$$

and G is a large, N×N submatrix of A. The passive, reduced power grid conductance matrix, G' serves as the major sub-matrix constituent of matrix A, and represents a compact, port-wise, electrically identical representation of all of the power grid resistive elements.

Using node ordering, Eq. 6 can be written as follows:

$$\begin{bmatrix} G_{pp} & G_{pi} \\ G_{ip} & G_{ii} \end{bmatrix} \begin{bmatrix} v_p \\ v_i \end{bmatrix} = \begin{bmatrix} i_p \\ i_i \end{bmatrix}, \quad \text{(Eq. 7)}$$

where:

$G_{pp}$ is the MNF admittance representation of resistors connecting two port nodes, $G_{ip}$ and $G_{pi}$ are the MNF admittance representations of resistors connecting port- and internal nodes, $G_{ii}$ is the MNF admittance representation of resistors connecting two internal nodes, $v_p$ is the vector of $n_p$ port voltages, $v$ is the vector of $(N-n_p)$ internal node voltages, $i_p$ is the vector of current sources attached to port nodes, and $i_i$ is the vector of current sources attached to internal nodes.

Note that, by definition, all elements of $i_i$ are zero (this approach never attaches current sources to "internal" power-grid nodes).

Now, since the internal port voltages are of no interest, and $i_i=0$, Eq. 6 can be re-written in terms of the port nodes only, i.e., $$G'' v_p = i_p, \quad \text{(Eq. 8)}$$

where $$G' = G_{pp} - (G_{pi} \cdot G_{ii}^{-1} \cdot G_{ip}). \qquad \text{(Eq. 9)}$$

The $n_p \times n_p$ matrix G' is called the "reduced network conductance matrix," and the quantity of ungrounded port nodes, $n_p$, is significantly smaller than N, the total number of ungrounded network nodes, i.e., $n_p \ll N$. It is straightforward to use G' (instead of G) for the generation of matrix A, and it is this effective node reduction which allows for the efficient solution of Eq. 6 at each step of the iterated placement/analysis process.

During initial placement of the circuit-design cell objects on the power grid and ports (as indicated by step 120, FIG. 6), the object library and x-y port location data is used, in step 122, to determine the average current required at each port, 28, (FIG. 2) corresponding to the current-source port nodes shown in FIG. 7. The total average node current at each port is calculated by summing the current requirements for all of the circuits, or portions of circuits, located in close proximity to the port (e.g., 30, in FIG. 3). This technique (step 122, FIG. 6) can be applied directly and efficiently to compute the values of the current sources employed in the MNF analysis described previously. Together, the current sources and applied voltage sources comprise the right-hand-side vector, b, in Eqs. 2 and 4. Since the MNF matrix, A, and its LU decomposition have been computed beforehand (from the pre-determined passive power-grid resistance network, 40, FIG. 7), there exists an efficient and straightforward sequence of calculations (forward/back substitutions), step 124, which can be exercised to obtain the vector of port node voltages, $v_p$. For "current-source port nodes", 44, FIG. 7, the port voltages in $v_p$ correspond directly to the local voltage supply (collapse) values associated with each port region of the chip being designed. In step 126, these port voltages are compared to each cell in each region of the chip and to each corresponding supply operating range (using the object library data, 112) which yields the acceptable supply collapse "tolerance" for each circuit. Given this information, step 128 determines whether the computed port voltages are within their predetermined, desired operating range. For each port voltage which falls outside its desired range, an appropriate penalty is added to the "supply-collapse" cost (P in Eq. 1) associated with the corresponding circuit placement. At insertion point "A", the total "supply-collapse" cost is transferred to the "overall" cost function calculation (all terms in Eq. 1), step 104 in FIG. 5.

While traditional, prior art floorplanning methodology takes into account performance, routability, area, and the like, the per-iteration cost function associated with the new method can be formatted to consider those metrics as well as the voltage supply collapse. In both cases, the cost function depends on more than one parameter. Similarly, both methods permit cost tailoring that, when appropriate, allows one to weigh the importance of one metric more heavily than others, and the like. An added benefit, i.e., an accounting for noise tolerance directly during floorplanning, is gained through straightforward library pre-characterization and the trivial runtime expense associated with the computation of the power-grid port node voltages at each iteration of FIG. 6.

In analyzing supply voltage drops in a power grid, the method of the present invention may be embodied as a computer program product stored on a program storage device. This program storage device may be devised, made and used as a component of a machine utilizing optics, magnetic properties and/or electronics to perform the method steps of the present invention. Program storage devices include, but are not limited to, magnetic disks or diskettes, magnetic tapes, optical disks, Read Only Memory (ROM), floppy disks, semiconductor chips and the like. A computer readable program code means in known source code may be employed to convert the methods described below for use on a computer. The computer program or software incorporating the process steps and instructions described further below may be stored in any conventional computer, for example, that shown in FIG. 8. Computer 50 incorporates a program storage device 52 and a microprocessor 54. Installed on the program storage device 52 is the program code incorporating the method of the present invention, as well as any database information for the library of circuits used in designing the integrated circuit chip.

Thus, the present invention provides an improved power supply voltage analysis method for use during early stages of designing of integrated circuit chips which evaluates noise sensitivity of such integrated circuit chips.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing an integrated circuit within a power grid comprising:
    characterizing circuits in a circuit library for supply currents and voltage ranges;
    constructing a power grid model based on general power requirements of the integrated circuit under design;
    calculating an impedance matrix representing impedance between ports in the power grid model;
    assigning selected circuits from the library to the ports;
    calculating current and voltage at each of the ports;
    using a cost function, based on said calculated current and voltage, and on said characterized currents and voltage ranges, to calculate a cost of placement of the assigned circuits; and
    perturbing the assignment of the circuits, if the cost of such placement does not meet design requirements.

2. The method of claim 1, wherein the current at each of the ports is calculated by summing current requirements of all of the circuits located in the region of each port.

3. The method of claim 2, wherein the voltage at each of the ports is calculated by solving a system of linear equations involving a power-grid resistor network and applied voltage and current sources, whose matrix representation has been reduced and pre-factorized to permit system solution via direct forward and/or backward substitution.

4. The method of claim 1, wherein each circuit in the circuit library is characterized to determine its average DC supply current requirement and power-supply voltage range for which it functions acceptably.

5. The method of claim 4, further including, for each circuit in the circuit library, tabulating current values which depend on relative placement and load to approximate the supply current dependence on output capacitance.

6. The method of claim 1, wherein the power grid model represents circuit ports defined by intersection of the power grid model and a physical power grid of an integrated circuit.

7. The method of claim 6, wherein the power grid model has a periodicity of a multiple of the periodicity of the physical power grid of the integrated circuit.

8. The method of claim 1, further including, after calculating the impedance matrix, assigning regions of the power grid to each of the ports.

9. The method of claim 1, further including, after calculating current and voltage at each port, imposing a penalty to each port having a node voltage outside of a predetermined range.

10. A program storage device readable by a machine, tangibly embodying a program of instructions executable by the machine to perform method steps for designing an integrated circuit within a power grid using a library of circuits, said method steps comprising:

characterizing circuits in the library for supply currents and voltage ranges;

constructing a power grid model based on general power requirements of the integrated circuit under design;

calculating an impedance matrix representing impedance between ports in the power grid model;

assigning selected circuits from the library to the ports;

calculating current and voltage at each of the ports;

using a cost function, based on said calculated current and voltage, and on said characterized currents and voltage ranges, to calculate a cost of placement of the assigned circuits; and perturbing the assignment of the circuits, if the cost of such placement does not meet design requirements.

11. The program storage device of claim 10 wherein, in the method steps, the current at each of the ports is calculated by summing current requirements of all of the circuits located in the region of the port.

12. The program storage device of claim 11 wherein, in the method steps, the voltage at each of the ports is calculated by solving a system of linear equations involving a power-grid resistor network and applied voltage and current sources, whose matrix representation has been reduced and pre-factorized to permit system solution via direct forward and/or backward substitution.

13. A computer program product comprising a computer usable medium having computer readable program code means embodied therein for designing an integrated circuit within a power grid, the computer program product utilizing a library of circuits for use in designing an integrated circuit chip, the computer readable program code means in said computer program product comprising:

computer readable program code means for characterizing the circuits in the library for supply currents and voltage ranges;

computer readable program code means for constructing a power grid model based on general power requirements of the integrated circuit under design;

computer readable program code means for calculating an impedance matrix representing impedance between ports in the power grid model;

computer readable program code means for assigning selected circuits from the library to the ports;

computer readable program code means for calculating current and voltage at each of the ports;

computer readable program code means for using a cost function, based on said calculated current and voltage, and on said characterized currents and voltage ranges, to calculate a cost of placement of the assigned circuits; and computer readable program code means for perturbing the assignment of the circuits, if the cost of such placement does not meet design requirements.

14. The computer program product of claim 13, wherein the current at each of the ports is calculated by summing current requirements of all of the circuits located in the region of each port.

15. The computer program product of claim 14, wherein the current at each of the ports is calculated by multiplying a vector of node currents by the impedance matrix.

* * * * *